United States Patent
Muchow et al.

(10) Patent No.: US 10,175,473 B2
(45) Date of Patent: Jan. 8, 2019

(54) MICROMIRROR ARRAY AND METHOD FOR THE MANUFACTURE THEREOF

(71) Applicant: Robert Bosch GmbH, Stuttgart (DE)

(72) Inventors: Joerg Muchow, Reutlingen (DE); Rainer Straub, Ammerbuch (DE); Johannes Baader, Freiburg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/313,208

(22) PCT Filed: May 29, 2015

(86) PCT No.: PCT/EP2015/061966
§ 371 (c)(1),
(2) Date: Nov. 22, 2016

(87) PCT Pub. No.: WO2015/193080
PCT Pub. Date: Dec. 23, 2015

(65) Prior Publication Data
US 2017/0205621 A1    Jul. 20, 2017

(30) Foreign Application Priority Data
Jun. 17, 2014    (DE) .......................... 10 2014 211 546

(51) Int. Cl.
*G02B 26/08*    (2006.01)
*B81B 3/00*    (2006.01)
*B81C 1/00*    (2006.01)

(52) U.S. Cl.
CPC .......... *G02B 26/0833* (2013.01); *B81B 3/007* (2013.01); *B81C 1/00658* (2013.01); *B81B 2201/042* (2013.01)

(58) Field of Classification Search
CPC ............ G02B 26/0833; G02B 26/0841; G02B 6/3518; B81C 1/00658; B81C 1/00825; B81B 3/00; B81B 3/007; B81B 2201/042
(Continued)

(56) References Cited

U.S. PATENT DOCUMENTS 6,236,490 B1    5/2001    Shen
6,259,548 B1    7/2001    Tsugai et al.
(Continued)

FOREIGN PATENT DOCUMENTS

CN    102570766 A    7/2012
CN    102955249 A    3/2013
(Continued)

OTHER PUBLICATIONS

International Search Report dated Aug. 5, 2015, of the corresponding International Application PCT/EP2015/061996 filed May 29, 2015.

*Primary Examiner* — Euncha Cherry
(74) *Attorney, Agent, or Firm* — Norton Rose Fulbright US LLP; Gerard Messina

(57) ABSTRACT

A micromirror array is provided having a mirror membrane, including a first supporting element, including for each first supporting element, a first coupling element that is located between the mirror membrane and the particular first supporting element and is formed to mechanically couple the particular first supporting element to the mirror membrane; having at least one second supporting element that is mechanically coupled to the at least one first supporting element; and having a second coupling element for each second supporting element that is formed to be mechanically contacted. Also a method for manufacturing a micromirror array according to the present inventions described.

12 Claims, 6 Drawing Sheets

(58) Field of Classification Search
USPC .................................................... 359/223.1
See application file for complete search history.

(56) References Cited

U.S. PATENT DOCUMENTS

| | | | |
|---|---|---|---|
| 2003/0210447 A1 | 11/2003 | Sniegowski et al. | |
| 2010/0018635 A1* | 1/2010 | Kouma | B81C 1/00825 |
| | | | 156/155 |
| 2012/0099176 A1* | 4/2012 | Zhou | G02B 26/0841 |
| | | | 359/291 |

FOREIGN PATENT DOCUMENTS

| | | |
|---|---|---|
| DE | 102010064218 A1 | 6/2012 |
| WO | 2013081458 A2 | 6/2013 |

\* cited by examiner

MICROMIRROR ARRAY AND METHOD FOR THE MANUFACTURE THEREOF

FIELD

The present invention relates to a micromirror array and to a method for manufacturing a micromirror array according to the present invention.

BACKGROUND INFORMATION

Micromirrors are used today in an ever increasing number of applications. These include projectors, scanners or the like, for example. The advantage of micromirrors resides in that they require little space and are, therefore, very flexible to use.

Micromirrors are typically microelectromechanical elements that can be patterned and manufactured using known semiconductor processing methods, for example.

Different methods can be used to realize the deflection of the mirrors in such a micromirror. Electrostatic driving methods, magnetic driving methods, piezoelectric methods or the like can be used, for example. Some driving methods merely allow tilting of the micromirror in one direction. Other driving methods also allow tilting of the micromirror in two directions.

If there is a very rapid movement of the micromirror, it is problematic that the mirror or the mirror membrane is subject to a dynamic deformation. If the mirror surface is no longer plane due to the dynamic deformation, this may negatively affect the mirroring and thus, for example, the functioning of a projector.

A conventional micromirror system is described, for example, in U.S. Pat. No. 6,259,548 B1.

SUMMARY

A micromirror array is provided having a mirror membrane, including a first supporting element; for each first supporting element, including a first coupling element that is located between the mirror membrane and the particular first supporting element and formed to mechanically couple the particular first supporting element to the mirror membrane; having at least one second supporting element that is mechanically coupled to the at least one first supporting element; and, for each second supporting element, having a second coupling element that is formed to be mechanically contacted.

Also provided is a method for manufacturing a micromirror array according to the present invention from an SOI (silicon on insulator) wafer that has an oxide layer between a first silicon layer and a second silicon layer, including patterning the second silicon layer to form a mirror membrane and of the first silicon layer to form at least one first supporting element of a first thickness; patterning the first silicon layer to format least one second supporting element of a second thickness in a way that allows the at least one second supporting element to be mechanically coupled to the at least one first supporting element; the first thickness being smaller than the second thickness; attaching a second coupling element for each of the second supporting elements on the side of the particular supporting element facing away from the oxide layer in a way that allows a first coupling element formed from a first oxide to remain only between the mirror membrane and the at least one first supporting element.

DETAILED DESCRIPTION OF EXAMPLE EMBODIMENTS

Embodiments of the present invention take into account the realization that a contacting of the mirror membrane of a micromirror in the center, over a large area, as is common today, may result in the sides of the mirror membrane that project beyond the contacted region deforming, as they lag behind the actual movement of the mirror membrane and overshoot in response to a reversal of the direction of movement.

In accordance with the present invention, this realization is taken into account and an improved micromirror array is provided in which the mirror membrane is contacted by first coupling elements merely at coupling points defined by first supporting elements.

In this type of contacting, force is no longer transmitted to the mirror membrane over a large surface area in the center of the mirror membrane. Rather, the force may be introduced into the mirror membrane in a pointwise manner and selectively in a way that prevents or at least reduces the overshoot of individual portions of the mirror membrane.

The present invention also provides second supporting elements that are mechanically coupled to the first supporting elements and are able to be contacted by second coupling elements.

This makes it possible to couple a spring, for example, to the second coupling elements that transmits a movement to the micromirror array that is retransmitted via the second coupling elements to the second supporting elements, and by the second supporting elements via the first supporting elements and the first coupling elements to the mirror membrane.

The present invention provides a very simple method for manufacturing the micromirror array according to the present invention.

For that, the method provides that an SOI (a silicon on insulator) wafer be used for manufacturing the micromirror array. Both the first supporting elements, as well as the second supporting elements are thereby formed in the first silicon layer. The mirror membrane is formed in the second silicon layer.

The method also provides for attaching the second coupling elements to the second supporting elements. The second coupling elements are each located on the side of the particular second supporting element facing away from the oxide layer.

Finally, the oxide layer is etched in a way that allows the first coupling elements to remain between the mirror membrane and the first supporting elements following the etching process.

Using an SOI wafer has the advantage of making it possible to very precisely define the thickness of both the first silicon layer, and thus of the first and second supporting elements, as well as of the second silicon layer, and thus of the mirror membrane. In addition, different etching processes may be used for the silicon and the oxide that, in each case, do not attack the material that is not to be etched. Thus, the oxide and the silicon may be readily patterned independently of one another.

Advantageous specific embodiments and refinements are described herein with reference being made to the figures.

In a specific embodiment, at least one web is provided that is formed to mechanically intercouple the at least one first supporting element and the at least one second supporting element. This makes possible a very simple coupling of the first and second supporting elements and simplifies removal of the oxide layer during fabrication of the micromirror array.

In a specific embodiment, the at least one second supporting element is formed as a web, and the at least one web is disposed at a predefined angle, in particular at an angle of 90° or 45°, to the at least one second supporting element. This allows a very flexible positioning of the second supporting element relative to the at least one web and the first supporting elements.

In a specific embodiment, the first coupling elements are each configured at the ends of the at least one web. This allows a very flexible positioning of the first coupling elements and, thus, of the contact points relative to the mirror membrane.

In a specific embodiment, the first coupling elements are distributed over the length of the at least one web, in particular symmetrically disposed relative to a central axis of the mirror membrane. This likewise allows a very flexible positioning of the first coupling elements and, thus, of the contact points relative to the mirror membrane.

In a specific embodiment, the first coupling elements are punctiform and/or circular. This makes possible a simple punctiform contacting of the mirror membrane.

In a specific embodiment, the first coupling elements contact the mirror membrane at least at an edge region of the mirror membrane. The regions of the mirror membrane that are subject to especially strong accelerations in response to a dynamic movement of the mirror membrane are thereby supported.

In a specific embodiment, the first coupling elements couple the first supporting elements to the mirror membrane in a way that makes it possible to minimize a dynamic deformation of the mirror membrane in response to a movement of the micromirror array. For example, the optimal coupling points and, thus, the positions of the first supporting elements may be determined using a simulation. This makes it possible to minimize the deformation of the mirror membrane.

In a specific embodiment, the at least one first supporting element and/or the at least one second supporting element and/or the mirror membrane are formed with silicon. This makes possible a very simple patterning of the first supporting elements, of the second supporting and of the mirror membrane using controllable processes.

In a specific embodiment, the first coupling elements are formed with oxide. This makes possible a simple etching of the oxide layer, likewise using controllable processes.

In a specific embodiment, the second coupling elements are formed with germanium. This make possible a simple bonding of the second coupling elements for the contacting thereof.

In a specific embodiment, the at least one first supporting element is formed with silicon and is dimensioned in such a way that, in one etching process, the first coupling element that is formed with the corresponding oxide is not completely etched away between the mirror membrane and the first supporting element. This makes possible a very simple manufacturing of the first coupling elements.

In a specific embodiment, the at least one second supporting element is formed with silicon and is dimensioned in such a way that, in one etching process, an oxide layer present between the corresponding second supporting element and the mirror membrane is completely etched away. This makes possible a very simple removal of the oxide between the second supporting elements and the mirror membrane and thus a decoupling of the mirror membrane from the second supporting elements.

In a specific embodiment, the at least one web, that couples the first supporting elements to the second supporting elements, is formed with silicon and is dimensioned in such away that, in one etching process, an oxide layer present between the corresponding web and the mirror membrane is completely etched away.

In a specific embodiment, the patterning includes an etching, in particular an anisotropic etching, in particular also an etching with potassium hydroxide, KOH etching, or a trench etching. This makes possible a simple patterning using controllable processes.

In a specific embodiment, the etching of the oxide layer includes an isotropic etching, in particular, a wet chemical isotropic etching or an isotropic etching with a gas phase. This makes it possible for the oxide layer to be etched without the silicon being attacked.

The above embodiments and refinements may be combined in any desired, useful manner. Other possible embodiments, refinements and implementations of the present invention also include not explicitly named previous or subsequent combinations of inventive features described with reference to exemplary embodiments. In particular, one skilled in the art would also add individual aspects as improvements or supplements to the particular basic design of the present invention.

BRIEF DESCRIPTION OF THE DRAWINGS

The present invention is explained below on the basis of the exemplary embodiments shown in the schematic figures.

In all of the figures, like or functionally equivalent elements and devices—provided that nothing else is indicated—are provided with the same reference numerals.

DETAILED DESCRIPTION OF EXAMPLE EMBODIMENTS

Figure 1:
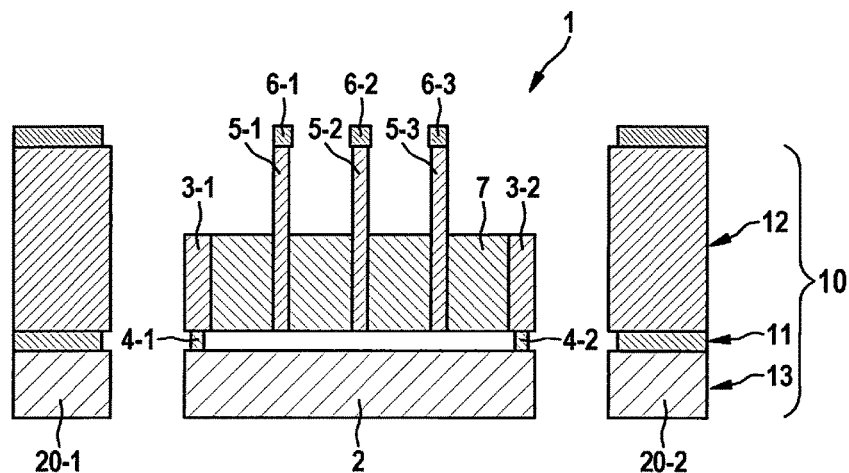
FIG. 1 shows a schematic representation of a specific embodiment of a micromirror according to the present invention.

FIG. 1 shows a schematic representation of a specific embodiment of a micromirror array 1 according to the present invention in a side view.

Micromirror array 1 has a mirror membrane 2, above which, two first supporting elements 3-1 and 3-2 and three second supporting elements 5-1-5-3 are configured at a defined distance. First supporting elements 3-1 and 3-2 are coupled via two first coupling elements 4-1, 4-2 to mirror membrane 2. The two first coupling elements 4-1, 4-2 thereby define the distance between mirror membrane 2 and the two first supporting elements 3-1 and 3-2 and the three second supporting elements 5-1-5-3. In addition, first supporting elements 3-1, 3-2 are coupled via a web 7 to the three second supporting elements 5-1-5-3, so that the three second supporting elements 5-1-5-3 are fixed relative to mirror membrane 2, even without a direct coupling to mirror membrane 2.

On the side of the three second supporting elements 5-1-5-3 facing away from mirror membrane 2, a second coupling element 6-1-6-3 is configured in each case. Second coupling elements 6-1-6-3 are used for mechanically contacting micromirror array 1 and for fastening the same, for example, to a spring or the like that micromirror array 1 bears in operation.

For illustration purposes, FIG. 1 shows a specific embodiment of micromirror array 1, that has two first supporting elements 3-1 and 3-2 and three second supporting elements 5-1-5-3. First supporting elements, second supporting elements, as well as first and second coupling elements may be more or less provided in further specific embodiments.

In a specific embodiment, micromirror device 1 is fabricated from a single SOI wafer 10, thus from a wafer 10 that is formed from an oxide layer 11 between a first silicon layer 12 and a second silicon layer 13. This makes it possible to determine the thickness of mirror membrane 2 and, in particular, also the distance between mirror membrane 2 and first and second supporting elements 3-1, 3-2 and 5-1-5-3 by properly selecting SOI wafer 10. In addition, SOI wafer 10 makes possible a very simple manufacturing of micromirror array 1, as it may be fabricated from SOI wafer 10 using simple etching steps. Possible specific embodiments of the manufacturing method are explained in the context of FIG. 2.

Also shown in FIG. 1 to the right and left of the described elements are housing sections 20-1, 20-2.

Figure 2:
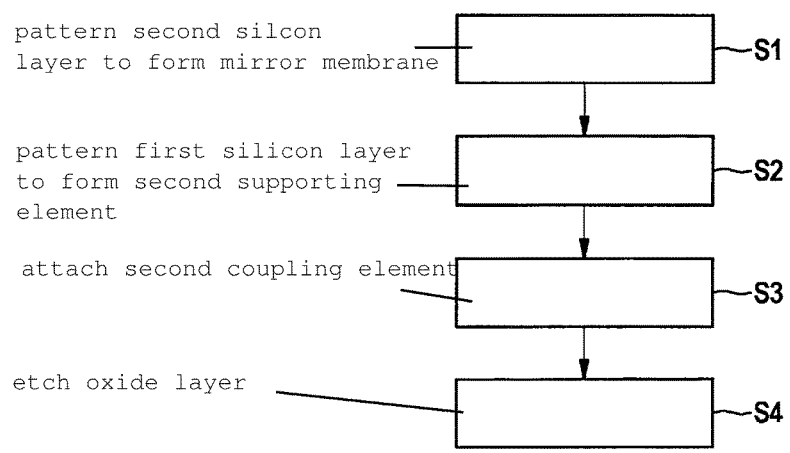
FIG. 2 shows a flow chart of a specific embodiment of a method according to the present invention.

FIG. 2 shows a flow chart of a specific embodiment of a method according to the present invention where a micromirror array 1 according to the present invention may be fabricated in an SOI wafer 10, that is formed with an oxide layer 11 between a first silicon layer 12 and a second silicon layer 13.

The method provides for patterning S1 second silicon layer 13 to form a mirror membrane 2. In addition, the method provides for patterning first silicon layer 12 to form at least one supporting element 3-1-3-22 of a first thickness.

In S2, the method provides for patterning first silicon layer 12 to form at least one second supporting element 5-1-5-3 of a second thickness in a way that allows the at least one second supporting element 5-1-5-3 to be mechanically coupled to the at least one first supporting element 3-1-3-22, the first thickness being smaller than the second thickness. Thus, in S2, in accordance with one specific embodiment, for example, webs 7, 7-1-7-21 may also be formed that mechanically couple the at least one second supporting element 5-1-5-3 to the at least one first supporting element 3-1-3-22.

S3 provides for attaching a second coupling element 6-1-6-3 for each of the second supporting elements 5-1-5-3 on the side of the particular second supporting element 5-1-5-3 facing away from oxide layer 11. Finally, S4 provides for etching oxide layer 11 in a way that allows a first coupling element 4-1-4-22, in each instance formed with a first oxide, to remain only between mirror membrane 2 and the at least one first supporting element 3-1-3-22.

The term "thickness" is understood here to refer to the thickness or width of the particular element in a side view. Thus, an element that is thicker than another has a larger surface area than the mirror membrane; respectively, from the edges thereof, features a larger distance to the center thereof. This is important in order to be able to completely remove the oxide layer underneath the thinner elements during etching, and at least partially leave the oxide layer under the thicker elements.

In a specific embodiment, to manufacture first coupling elements 4-1-4-22, the at least one first supporting element 3-1-3-22, and the at least one second supporting element 5-1-5-3 are dimensioned to allow the oxide between the at least one second supporting element 5-1-5-3 and mirror membrane 2 to be completely etched away during etching S4 of oxide layer 11, and first coupling element 4-1-4-22 to at least partially remain in oxide layer 11 between the at least one first supporting element 3-1-3-22 and mirror membrane 2.

Within the scope of the present invention and in a specific embodiment, the patterning may include an etching, in particular an anisotropic etching, in particular also an etching with potassium hydroxide, KOH etching, or a trench etching. In a specific embodiment, the etching of oxide layer 11 may include an isotropic etching, in particular, a wet chemical isotropic etching or an isotropic etching with a gas phase.

The sequence of the individual manufacturing steps described above is merely exemplary and may deviate from that illustrated in further specific embodiments.

Figure 3:
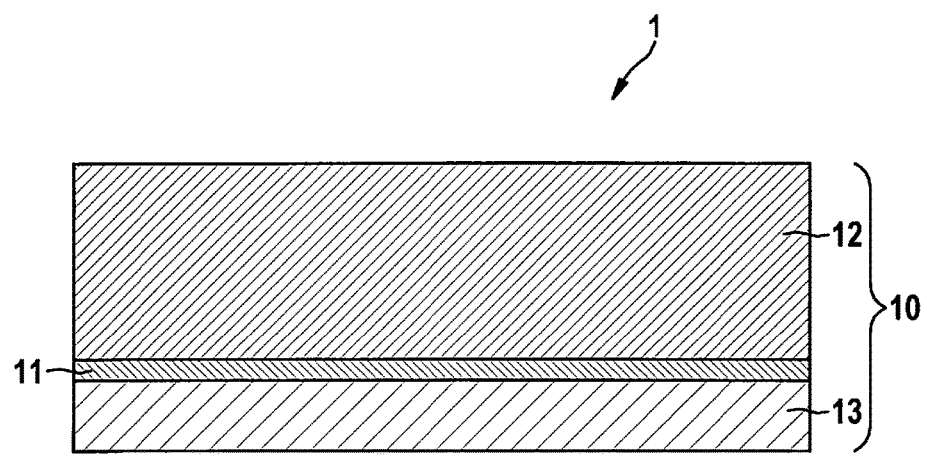
FIG. 3 shows a schematic representation of a specific embodiment of a micromirror array according to the present invention.

FIG. 3 shows a schematic representation of a specific embodiment of an inventive micromirror array 1 of FIG. 1 prior to a processing of SOI wafer 10.

FIG. 3 through 6 show micromirror array 1 in a side view, as in FIG. 1. It may be micromirror array of FIG. 7, for example. Therefore, FIGS. 1 and 3-6 show it in a side view along central axis 8 of mirror membrane 2, as illustrated in FIG. 7.

FIG. 3 shows the SOI wafer in the initial state thereof in which a first silicon layer 12 resides above oxide layer 11, and a second silicon layer 13 underneath oxide layer 11.

Figure 4:
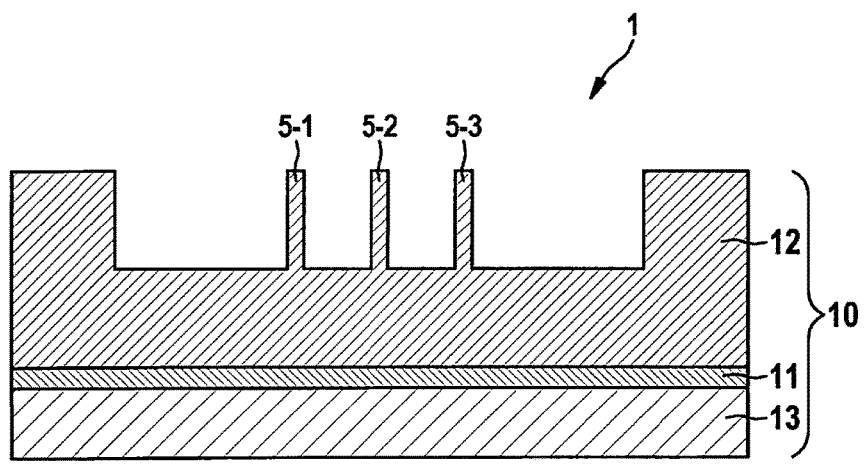
FIG. 4 shows a schematic representation of a specific embodiment of a micromirror array according to the present invention.

FIG. 4 shows a schematic representation of a specific embodiment of an inventive micromirror array 1 of FIG. 3, following a first manufacturing step.

In FIG. 4, second supporting elements 5-1-5-3 are formed by a first patterning process, which may be an etching process, for example.

Figure 5:
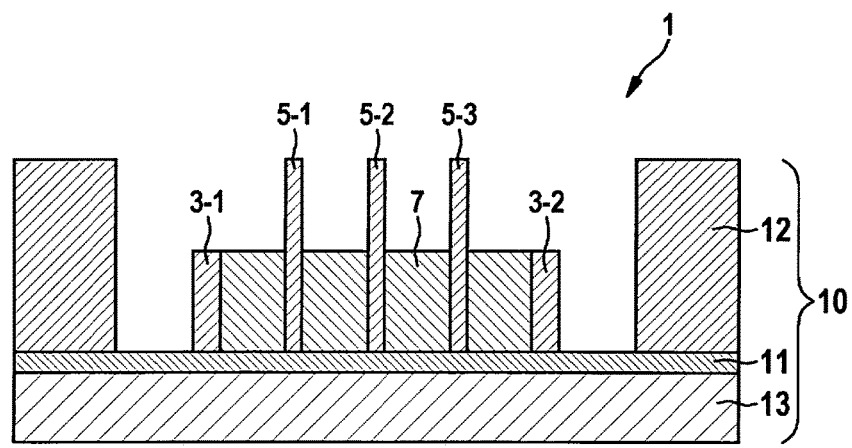
FIG. 5 shows a schematic representation of a specific embodiment of a micromirror array according to the present invention.

FIG. 5 schematically shows a specific embodiment of an inventive micromirror array 1 of FIG. 4 in accordance with a further manufacturing step.

In FIG. 5, a further etching process is shown which forms first supporting elements 3-1, 3-2, which only have approximately half of the height of second supporting elements 5-1-5-3. In addition, web 7 was also already formed by the etching process.

Figure 6:
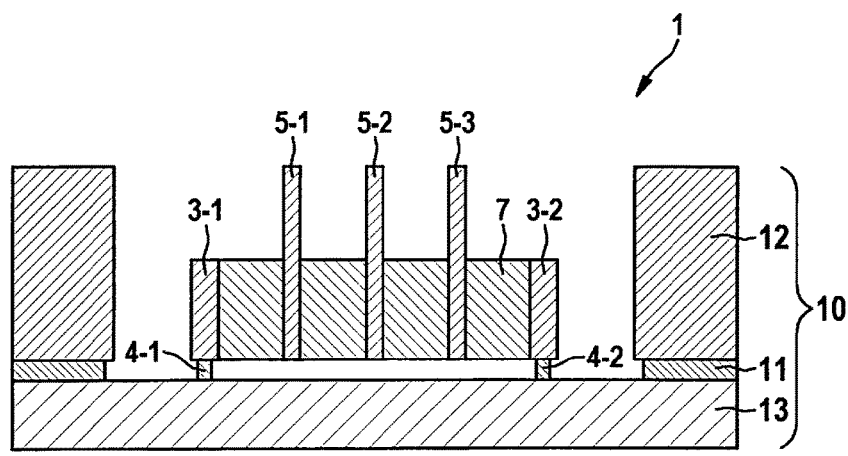
FIG. 6 shows a schematic representation of a specific embodiment of a micromirror array according to the present invention.
Figure 7:
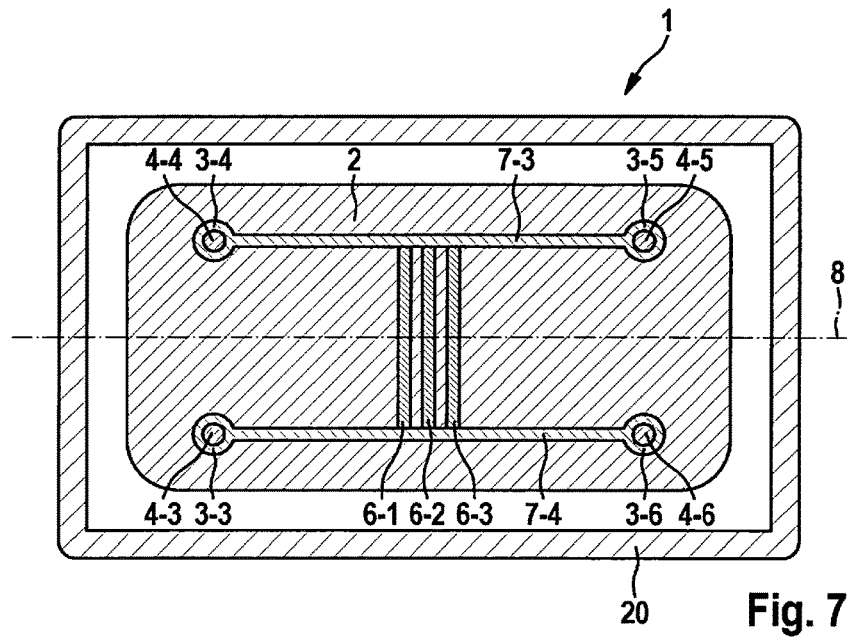
FIG. 7 shows a schematic representation of a specific embodiment of a micromirror array according to the present invention.

FIG. 6 shows a schematic representation of a specific embodiment of an inventive micromirror array 1 of FIG. 5 in accordance with a further manufacturing step.

FIG. 6 shows virtually complete micromirror array 1 following removal of oxide layer 11 by an etching process, beginning with micromirror array 1 of FIG. 5. The etching process is realized in such a way that oxide layer 11 remains merely underneath first supporting elements 3-1 and 3-2, and thus has formed first coupling elements 4-1, 4-2. The etching of oxide layer 11 may feature an isotropic etching, for example, in particular, a wet chemical isotropic etching or an isotropic etching with a gas phase.

FIG. 7 schematically illustrates a specific embodiment of a micromirror array 1 according to the present invention.

The micromirror array of FIG. 7 shows a plan view of micromirror array 1 of FIG. 1 from behind, thus on the side facing away from mirror membrane 2.

Mirror membrane 2 is approximately rectangular; mirror membrane 2 being larger in the horizontal direction than in the vertical direction and having rounded corners. This shape of mirror membrane 2 is merely to be seen as an example and may also differ, for example, be elliptical in another variant. In the plan view, it is discernible that a first supporting element 3-3-3-6 is configured in each of the corners. Supporting elements 3-3-3-6 are circular in shape, but not limited to this shape.

Configured underneath first supporting elements 3-3-3-6 are first coupling elements 4-3-4-6, which are likewise round in this specific embodiment. In principle, the shape of first coupling elements 4-3-4-6 is derived from the shape of first supporting elements 3-3 through 3-6, and the isotropic etching. Therefore, a multiplicity of shapes is possible. In FIG. 7-11, first coupling elements 4-3-4-6 are discernible, even if they are disposed underneath first supporting elements 3-3-3-6. This is merely to illustrate the present invention.

First supporting elements 3-3 and 3-6, which are configured at the bottom corners of mirror membrane 2, and first supporting elements 3-4 and 3-5, which are configured at the top corners of mirror membrane 2, are each intercoupled by a web 7-3, 7-4 and also coupled by webs 7-3, 7-4 to second supporting elements 5-1-5-3, that are not shown separately in FIG. 7, since second coupling elements 6-1-6-3 cover the same. Second supporting elements 5-1-5-3 and second coupling elements 6-1-6-3 each extend vertically between the two webs 7-3 and 7-4. Also disposed around mirror membrane 2 is a housing 20 that was left during the manufacturing process that had been described in connection with FIG. 2. This may be accomplished, for example, by properly carrying out the etching processes.

Figure 8:
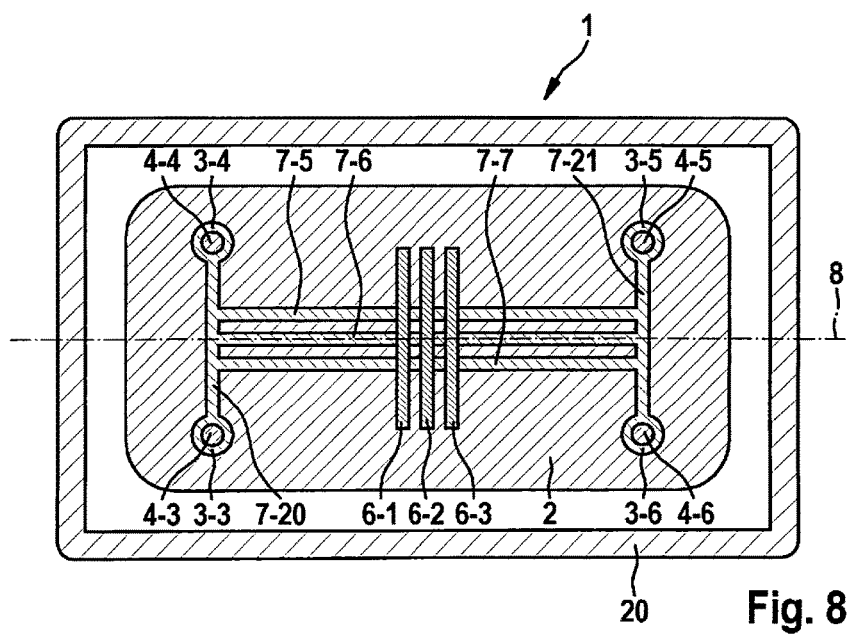
FIG. 8 shows a schematic representation of a specific embodiment of a micromirror array according to the present invention.

FIG. 8 schematically shows another specific embodiment of a micromirror array 1 according to the present invention.

Micromirror array 1 of FIG. 8 is based on micromirror array 1 of FIG. 7 and differs therefrom in that, in each case, a web 7-20 and 7-21 interconnects the two left first supporting elements 3-3 and 3-4 and the two right first supporting elements 3-5 and 3-6. In addition, three webs 7-5-7-7 are provided that connect the two webs 7-20 and 7-21 to the second coupling elements 6-1-6-3.

Thus, FIG. 8 shows an alternative specific embodiment of micromirror device 1, where mirror membrane 2 is contacted at the same sites as in FIG. 7, but the connections to second coupling elements 6-1-6-3 are differently configured.

Figure 9:
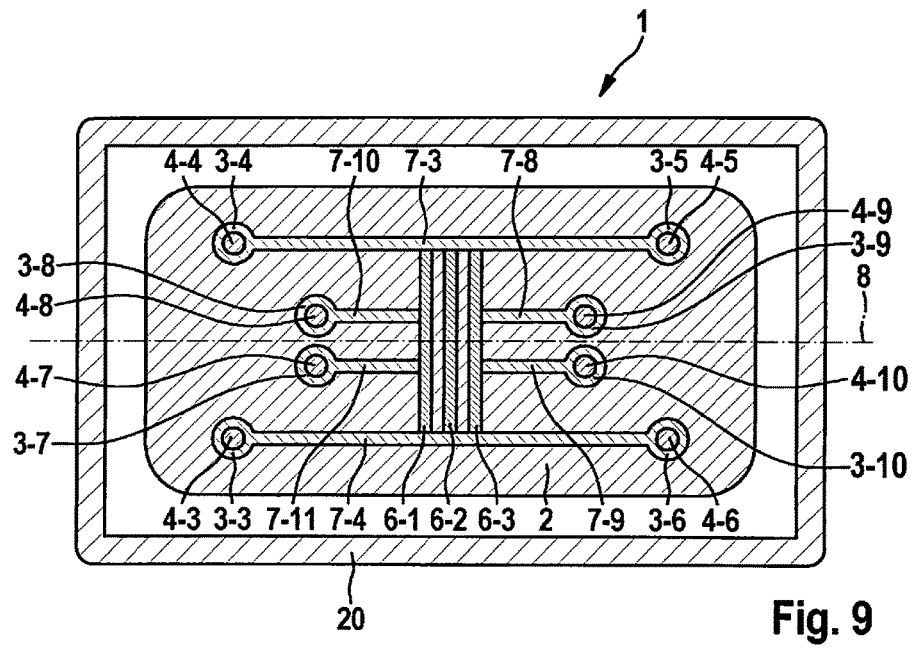
FIG. 9 shows a schematic representation of a specific embodiment of a micromirror array according to the present invention.

FIG. 9 schematically shows a specific embodiment of a micromirror array 1 according to the present invention that is based on micromirror array 1 of FIG. 7.

In FIG. 9, micromirror array 1 has four further first supporting elements 4-7-4-10. The two first supporting elements 3-7-3-8 and the two first supporting elements 3-9-3-10 are each disposed to the right and left of second supporting elements 5-1-5-3, respectively second coupling elements 6-1-6-3. In the vertical direction, first supporting elements 3-7 and 3-10 reside below central axis 8 of mirror membrane 2, and first supporting elements 3-8 and 3-9 above central axis 8 of mirror membrane 2.

Figure 10:
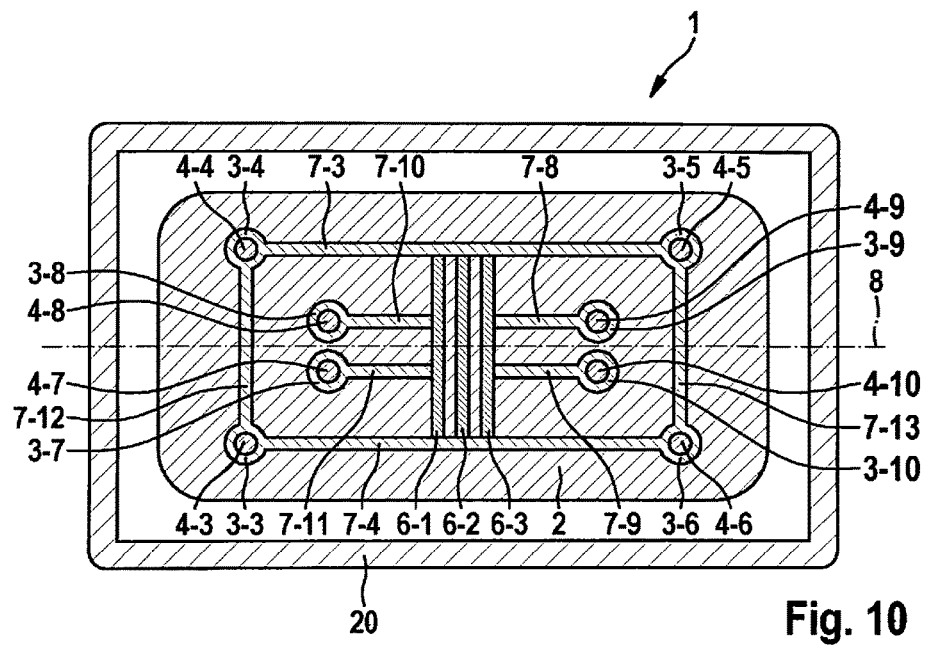
FIG. 10 shows a schematic representation of a specific embodiment of a micromirror array according to the present invention.

FIG. 10 schematically shows a specific embodiment of an inventive micromirror array 1 where the array resembles first supporting elements 3-3-3-6 and 3-7-3-10 of the array of FIG. 9.

In contrast to FIG. 9, the four first supporting elements 3-3-3-6 are intercoupled in each case by webs 7-3, 7-4 and 7-12-7-13, so that webs 7-3, 7-4 and 7-12-7-13 form a frame whose corners are the four first supporting elements 3-3-3-6. In addition, first supporting elements 3-7 and 3-10 and first supporting elements 3-8 and 3-9 are coupled in each case by a horizontally extending web 7-8-7-10 to corresponding second supporting elements 5-1, 5-3, as in FIG. 9.

Figure 11:
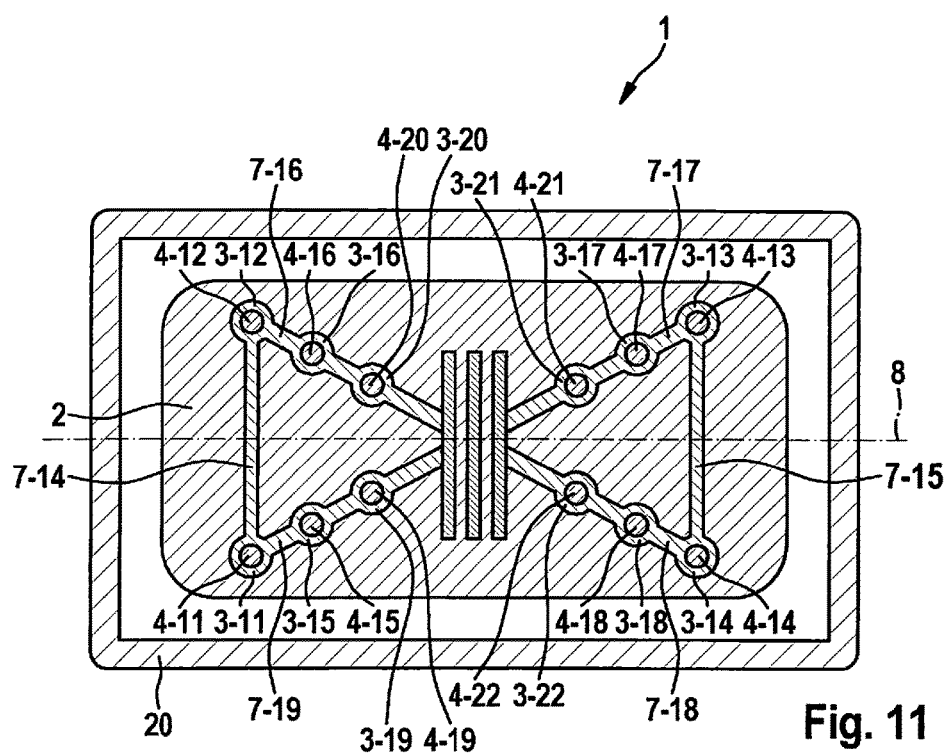
FIG. 11 shows a schematic representation of a specific embodiment of a micromirror array according to the present invention.

FIG. 11 schematically illustrates a specific embodiment of a micromirror array 1 according to the present invention.

In contrast to the previous specific embodiments, micromirror array 1 of FIG. 11 has twelve first supporting elements 3-11-3-22 that are arrayed in an X shape on mirror membrane 2. First supporting elements 3-11, 3-15 and 3-19 on the left, lower diagonal of the X shape are coupled by web 7-19 to second supporting element 5-1. First supporting elements 3-11, 3-16 and 3-20 on the left upper diagonal of the X shape are coupled by web 7-16 to second supporting element 5-1. First supporting elements 3-13, 3-17 and 3-21 on the right upper diagonal of the X shape are coupled by web 7-17 to second supporting element 5-3. Finally, first supporting elements 3-13, 3-17 and 3-21 on the right lower diagonal of the X shape are coupled by web 7-18 to second supporting element 5-3. The outermost, two left, first supporting elements 3-11 and 3-12 are intercoupled by a web 7-14, and the two right, outermost supporting elements 3-13 and 3-14 likewise by a web 7-15.

The arrays of first supporting elements 3-1-3-22 and of second supporting elements 5-1-5-3 described in the figures are merely exemplary and serve merely to illustrate the present invention. The number and array of the elements of micromirror array 1 according to the present invention may vary in other specific embodiments. The positions of first supporting elements 3-1-3-22 or of second supporting elements 5-1-5-3, for example, may be determined using a simulation that makes it possible to minimize the deformation of mirror membrane 2 used for the particular application in response to a movement thereof.

Although the present invention is described above on the basis of preferred exemplary embodiments, it is not limited thereto, but rather may be modified in numerous ways. In particular, the present invention may be modified in various ways without departing from the spirit and scope thereof.

What is claimed is:

1. A micromirror array, comprising:
a mirror membrane;
at least one first supporting element, wherein for each first supporting element, a first coupling element that is located between the mirror membrane and the first supporting element is formed to mechanically couple the first supporting element to the mirror membrane;

at least one second supporting element mechanically coupled to at least one first supporting element; and a second coupling element for each second supporting element, the second coupling element located on a side of the second supporting element facing away from the mirror membrane and formed to be mechanically contacted, wherein the first coupling element defines a first distance between the mirror membrane and the at least one first supporting element, and defines a second distance between the mirror membrane and the at least one second supporting element, wherein the first distance is equal to the second distance.

2. The micromirror array as recited in claim 1, further comprising:

at least one web formed to mechanically intercouple the at least one first supporting element and the at least one second supporting element.

3. The micromirror array as recited in claim 2, wherein the at least one second supporting element is web-shaped, and the at least one web is disposed at a predefined angle of 90° or 45° to the at least one second supporting element.

4. The micromirror array as recited in claim 2, wherein at least one of: i) the first coupling elements are each configured at the ends of the at least one web, or ii) the first coupling elements are distributed over a length of the at least one web, the first coupling elements being symmetrically distributed relative to a central axis of the mirror membrane.

5. The micromirror array as recited in claim 1, wherein at least one of: i) the first coupling elements are at least one of punctiform and circular, and ii) the first coupling elements contact the mirror membrane at at least one edge region of the mirror membrane.

6. The micromirror array as recited in claim 1, wherein the first coupling elements couple the first supporting elements to the mirror membrane in a way that minimizes a dynamic deformation of the mirror membrane in response to a movement of the micromirror array.

7. The micromirror array as recited in claim 1, wherein at least one of: i) at least one of the at least one first supporting element, the at least one second supporting element, and the mirror membrane, is formed with silicon, ii) the first coupling elements are formed with oxide, and iii) the second coupling elements are formed with germanium.

8. A micromirror array, comprising:

a mirror membrane;

at least one first supporting element, wherein for each first supporting element, a first coupling element that is located between the mirror membrane and the first supporting element is formed to mechanically couple the first supporting element to the mirror membrane;

at least one second supporting element mechanically coupled to at least one first supporting element; and a second coupling element for each second supporting element, the second coupling element formed to be mechanically contacted, wherein at least one of: i) at least one of the at least one first supporting element, the at least one second supporting element, and the mirror membrane, is formed with silicon, ii) the first coupling elements are formed with oxide, and iii) the second coupling elements are formed with germanium, wherein the at least one first supporting element is formed with silicon and is dimensioned in such a way that, in one etching process, the first coupling element that is formed with the corresponding oxide is not completely etched away between the mirror membrane and the first supporting element; and wherein the at least one second supporting element is formed with silicon and is dimensioned in such a way that, in one etching process, an oxide layer present between the corresponding second supporting element and the mirror membrane is completely etched away.

9. A method for manufacturing a micromirror array from an SOI wafer, that is formed with an oxide layer between a first silicon layer and a second silicon layer, the method comprising:

patterning the second silicon layer to form a mirror membrane, and the first silicon layer to form at least one first supporting element of a first thickness;

patterning the first silicon layer to form at least one second supporting element of a second thickness in a way that allows the at least one second supporting element to be mechanically coupled to the at least one first supporting, the first thickness being smaller than the second thickness;

attaching a second coupling element for each of the second supporting elements on the side of the particular second supporting element facing away from oxide layer; and etching the oxide layer in a way that allows a first coupling element, in each instance formed with a first oxide, to remain only between mirror membrane (2) and the at least one first supporting element.

10. The method as recited in claim 9, wherein the patterning includes an anisotropic etching, and one of an etching with potassium hydroxide, KOH etching, or a trench etching.

11. The method as recited in claim 9, wherein the etching of the oxide layer includes an isotropic etching including a wet chemical isotropic etching or an isotropic etching with a gas phase.

12. The method as recited in claim 9, wherein the at least one first supporting element and the at least one second supporting element are dimensioned to allow the oxide between the at least one second supporting element and the mirror membrane to be completely etched away during etching of the oxide layer, and the first coupling element to at least partially remain in the oxide layer between the at least one first supporting element and the mirror membrane.

* * * * *